United States Patent [19]

Wickens

[11] 4,225,380
[45] Sep. 30, 1980

[54] METHOD OF PRODUCING LIGHT EMITTING SEMICONDUCTOR DISPLAY

[76] Inventor: Justin H. Wickens, 1030 Mullen Way, Vista, Calif. 92083

[21] Appl. No.: 939,537

[22] Filed: Sep. 5, 1978

[51] Int. Cl.² .................. G02B 5/18; H01L 21/308
[52] U.S. Cl. .................. 156/657; 29/569 L; 29/576 R; 29/576 E; 29/578; 156/662; 313/499; 313/500; 350/162 ZP
[58] Field of Search .................. 156/656, 657, 662; 29/569 L, 578, 576 R, 576 E; 313/499, 500; 357/17; 350/162 ZP; 427/93

[56] References Cited

U.S. PATENT DOCUMENTS

| | | | |
|---|---|---|---|
| 3,443,140 | 5/1969 | Ing et al. | 357/17 |
| 3,631,360 | 12/1971 | Lehovec | 350/162 ZP |
| 3,649,836 | 3/1972 | Lehovec | 350/162 ZP |
| 3,649,837 | 3/1972 | Lehovec | 350/162 ZP |
| 3,728,009 | 4/1973 | Fedotowsky et al. | 350/162 ZP |
| 3,981,023 | 9/1976 | King et al. | 357/17 |
| 4,016,416 | 4/1977 | Shepard et al. | 350/162 ZP |
| 4,131,506 | 12/1978 | Namba et al. | 156/662 |

OTHER PUBLICATIONS

Genovese et al., "Phase Plate . . . System," IBM Technical Disclosure Bulletin, (5/66), vol. 8, No. 12, pp. 1796–1797.

Primary Examiner—Jerome W. Massie
Attorney, Agent, or Firm—R. S. Sciascia; G. J. Rubens

[57] ABSTRACT

A method is provided for mass production of a monolithic light emitting semiconductor display utilizing light emitting semiconductor devices formed in a monocrystalline silicon wafer and a covering of silicon dioxide formed into lens structures for controlling the light emitted by the semiconductor devices.

10 Claims, 6 Drawing Figures

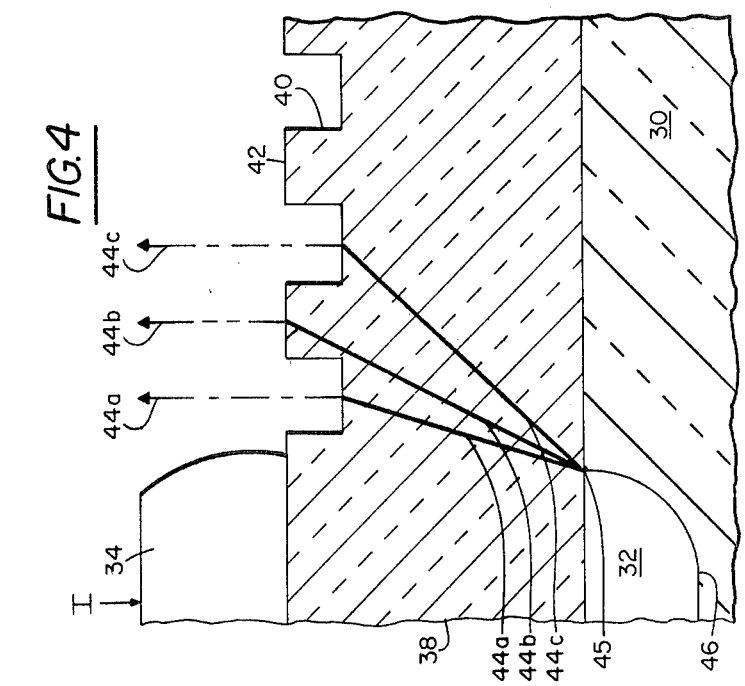
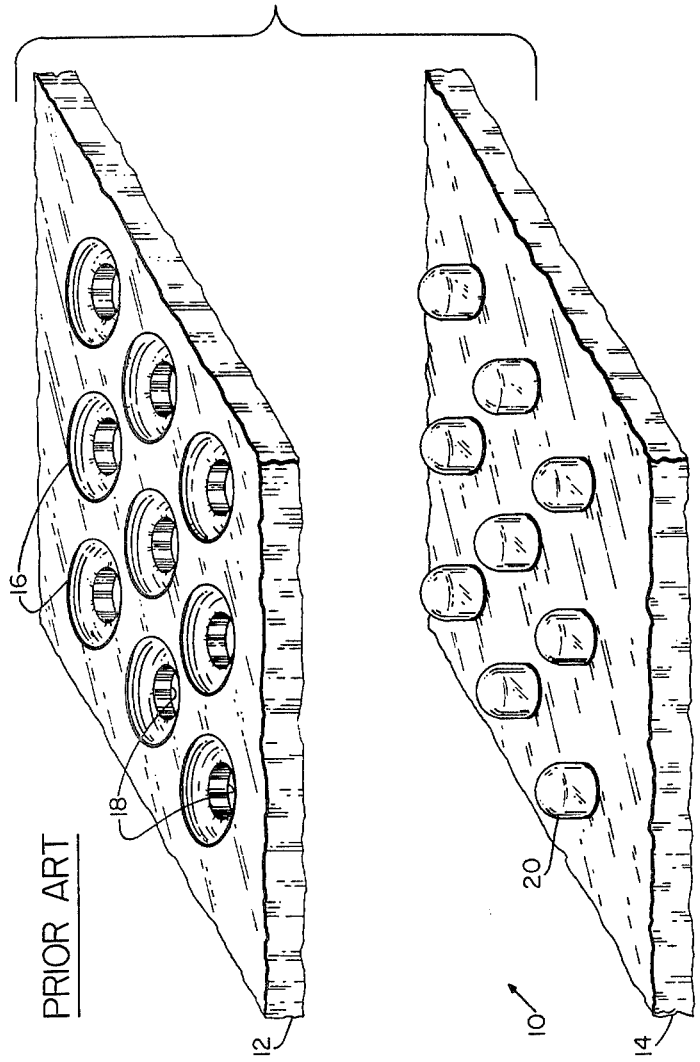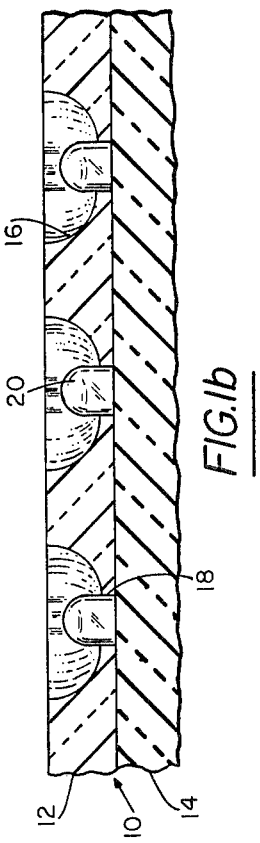

METHOD OF PRODUCING LIGHT EMITTING SEMICONDUCTOR DISPLAY

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

This invention relates to display devices, and more particularly, to monolithic light emitting semiconductor display having a lens structure integrated in the monocrystalline structure. Displays formed by light emitting semiconductor devices are frequently used because they afford reliability, ruggedness, and economy. In such art there is a pressing need to increase reliability and ruggedness, and to reduce cost by simplifying fabrication, so as to make use of such displays more practical.

One of the most recent advancements in the art of such displays consists of constructing a light emitting display array of two separate sections. The first section is substrate or base in which are mounted in a precise pattern a plurality or separately manufactured light emitting semiconductor devices, i.e. light emitting diodes (LED's). The second section consists of a glass plate having precisely etched or otherwise formed in its top surface a plurality of parabolically-shaped reflecting recesses. The two parts are secured together in a suitable manner with each reflecting recess carefully aligned with its respective LED in the substrate. Such a display array has advantages in that it is extremely reliable, rugged in construction, and provides a very flat display, i.e., a low ratio of display volume to area.

There is, however, a significant disadvantage in the above described display array because of the relatively high manufacturing cost. This disadvantage arises primarily because of the precision required in the etching of the reflecting surfaces, and in locating the LED's on the substrate, and in addition the precision that is required in mounting the reflector plate to the base so that each reflecting surface is very accurately aligned with its respective LED. This amounts to a large number of manufacturing steps and processes.

There is another prior art light emitting display using semiconductor devices together with integral lenses illustrated in U.S. Pat. No. 3,631,360 issued Dec. 28, 1971. This patented structure utilizes an integral Fresnel lens (zone plate) to focus the emitted light rays. The Fresnel lens comprises a planar arrangement of spaced opaque regions separated by transparent regions. Unfortunately, the use of opaque regions in the zone plate materially reduces the available light from the LED's which inherently produce barely enough light to be satisfactory for most applications.

The method of this invention greatly reduces the cost of fabricating light emitting display devices, maximizes the amount of useful light available from the semiconductors used in these displays, and greatly improves reliability.

SUMMARY OF THE INVENTION

A unique process for manufacturing a light emitting semiconductor display is presented that solves the above described deficiencies in prior art displays and thus broadens the applications in which said displays can be employed. The essence of the invention is the mass production (batch fabrication) of a display utilizing light emitting semiconductor devices formed in a monocrystalline silicon wafer by usual production process steps, but with an integral lens structure formed in the upper surface by the same process steps and during the same production operation as the light emitting semiconductor devices.

One of the usual production process steps is formation of an outer layer of silicon dioxide by oxidation of a monocrystalline silicon wafer. This layer is used to protect selected areas of the wafer during batch fabrication of devices, and to protect completed devices following their fabrication. This process step is particularly significant to the invention because the final silicon dioxide layer created by this step is increased in thickness and is formed into a Fresnel lens structure. This can be accomplished by etching or otherwise forming the surface of the silicon dioxide layer into the appropriate lens geometry. Thus the entire light emitting semiconductor display, including light emitting devices, metallization to provide metallic conductor paths, and the lens structure is batch fabricated in one continuous operation comprised of standard production process steps.

The display resulting from this invention can be of a size sufficient for use by itself, or it can be utilized as a building block for large displays.

STATEMENT OF THE OBJECTS

A principal object of this invention is to fabricate a light emitting semiconductor display at a lower cost.

Another important object is to fabricate such a display with greater useable light.

Still another important object is to achieve higher reliability and ruggedness in such a display.

Still another object of the invention is to fabricate the entire display as a monolithic structure in one continuous operation comprised of standard production process steps.

BRIEF DESCRIPTION OF THE DRAWINGS

FIG. 1a is an exploded cross-sectional view of a prior art light emitting display array greatly enlarged.

FIG. 1b is a cross section of the assembled display array of FIG. 1a.

FIG. 4 is a greatly enlarged partial cross-sectional view of the display device of FIGS. 2 and 3 showing the geometry of the light rays emanating from the light emitting region of the semiconductor device and passing through the lens structure.

DESCRIPTION OF THE PREFERRED EMBODIMENT

Figure 2:
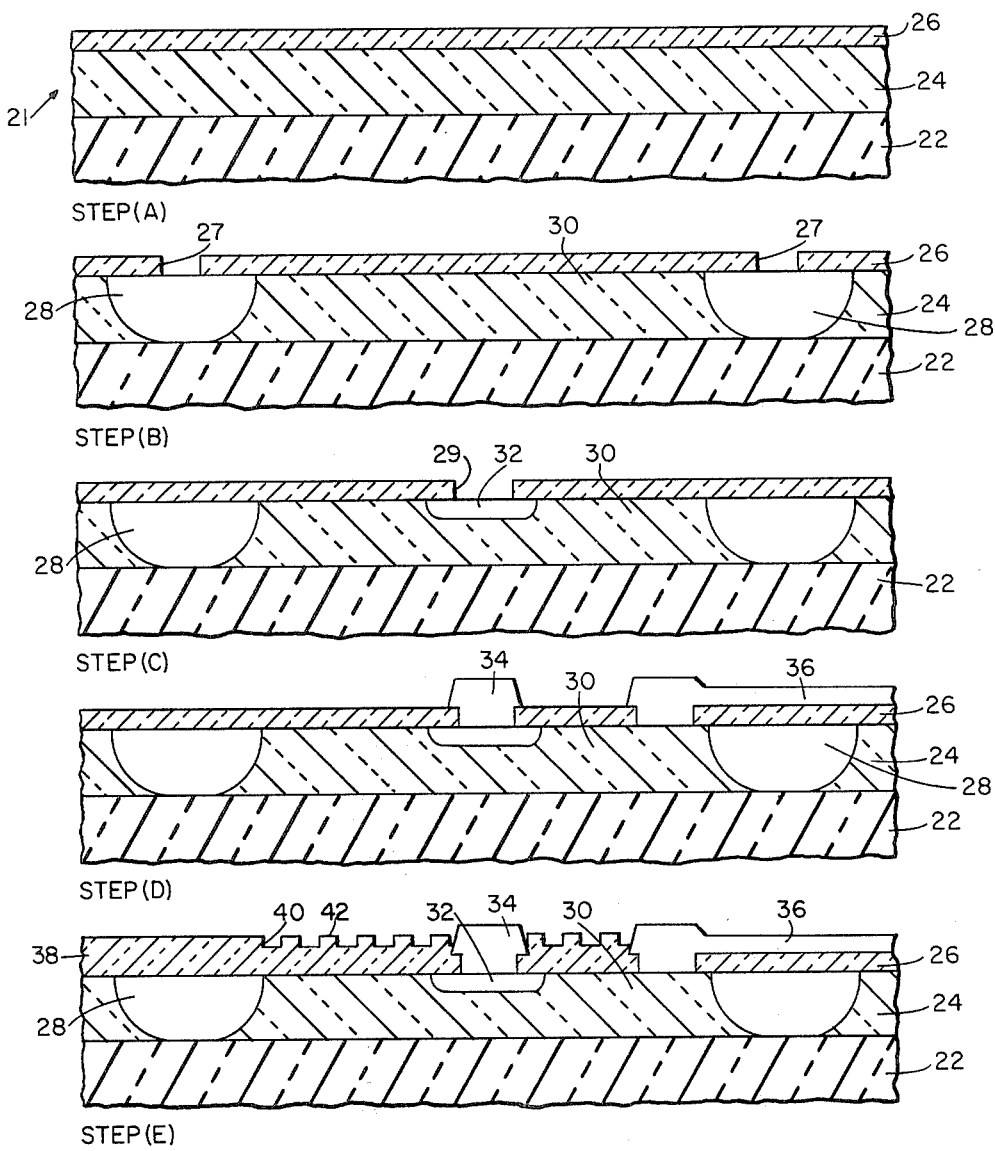
FIG. 2 illustrates the fabrication steps (A) to (E) of one form of the novel light emitting display device, in greatly enlarged cross-sectional views.

Referring to the drawings where like reference numerals refer to similar parts throughout the drawing there is shown in FIGS. 1a and 1b a prior art light emitting display 10 representing the current state of the art as presently used in many different applications. Display 10 is, as an example, a 3×3 semiconductor display array consisting of teo separate sections 12 and 14. Section 12 is a lens section made of transparent material, i.e. glass, in which is formed by precise etching or other techniques a plurality of parabolic reflecting recesses 16 each having a respective opening 18 extending through the bottom of section 12.

Section 14 is comprised of a substrate and a plurality of tiny separately manufactured light emitting diodes (LED's) 20 which are mounted on the substrate in a precise location and pattern, each to correspond with a respective parabolic reflecting recess 16. The electrical conductors to the LED's are fabricated within section 14, and are not shown. The lens section 12 must then be precisely aligned with the LED's of section 14, and the two sections secured in the perfectly aligned position with the LED's 20 extending through the respective openings 18. Summarizing, the manufacturing steps consist of fabricating the substrate, manufacturing the LED's, fabricating the lens array, aligning and mounting the LED's on the substrate, and finally aligning and securing the lens array to the LED array. Therefore, in addition to the complicated manufacturing processes and operations, the precision geometrical control required in this prior art method of fabrication dictates the high production cost involved, and makes high quality control difficult to achieve.

Figure 3:
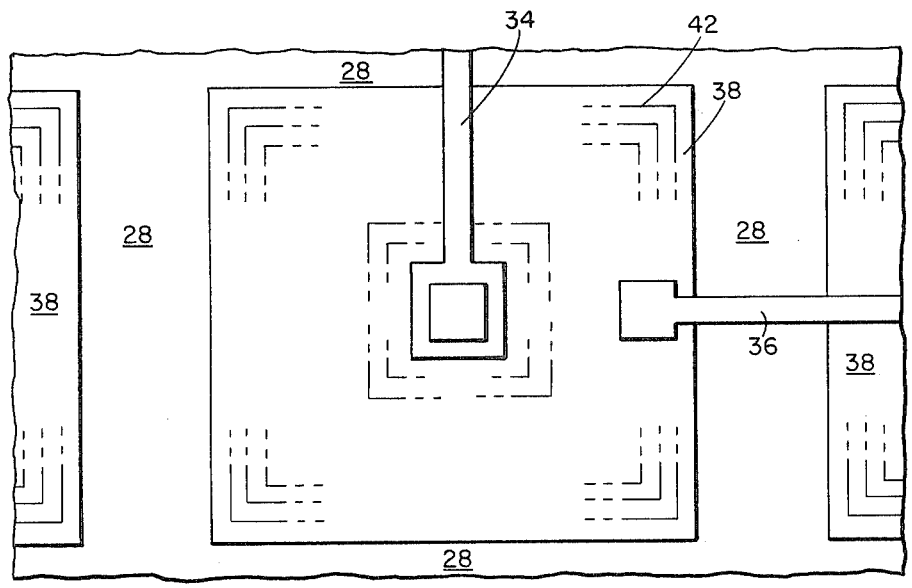
FIG. 3 is a top plan view of the novel display device fabricated by the procedure shown in FIG. 2.

Whereas the prior art method described in FIG. 1 requires a plurality of separate fabrication methods, the novel technique of fabricating the light emitting semiconductor display of this invention, as shown in FIGS. 2 and 3, utilizes a batch fabrication technique wherein all the steps are performed sequentially and continuously on a monolithic structure. In FIGS. 2 and 3, for simplification, only one light emitting semiconductor display device is illustrated as being fabricated, although it should be made clear that one of the principal features of the invention resides in the capability to fabricate an entire light emitting display array consisting of a plurality of such devices all of which are fabricated simultaneously.

During the well known technique of fabrication of monolithic silicon semiconductor devices, which include transistors, diodes, and combinations of such elements, a monocrystalline silicon wafer is subjected to a series of fabrication steps. This wafer is cut from a single cylindrical silicon crystal. At the present state of technology, the largest silicon crystal that can be grown is about four inches in diameter. Thus the wafer can be as large as four inches in diameter, and could produce a square piece of monocrystalline silicon greater than two inches on a side.

This fabrication process typically is initiated by epitaxial growth of an n-doped epitaxial layer on a p-doped silicon wafer which serves as the substrate. Then the surface of the epitaxial layer is oxidized to form a silicon dioxide layer of a thickness layer than 0.7 mils. This silicon dioxide layer serves as a protective layer over selected areas of the wafer during subsequent processing steps, and over completed devices following their fabrication.

In the present invention, as will be described in greater detail, in FIG. 2 to FIG. 5, a silicon wafer 21 is doped to create a p-doped substrate 22 upon which is grown an n-doped epitaxial layer 24. These steps are identical to those used in the current fabrication process. In the present invention, the wafer is then oxidized to form a protective outer layer 26 of silicon dioxide. It should be made clear that in the present invention the final resultant silicon dioxide layer 26 is substantially thicker than heretofore was the practice so that the silicon dioxide layer can be fabricated into a Fresnel lens structure integral to the wafer containing the light emitting semiconductors, e.g. the LED's, presently to be described.

In step (A) of FIG. 2, the p-doped substrate 22, the n-doped epitaxial layer 24, and the protective silicon dioxide layer 26 has been formed on and in the silicon wafer 21.

In step (B) illustrated in FIG. 2, isolation diffusion is performed by selectively etching $SiO_2$ layer 26 at 27 using an isolation mask (not shown) and making a deep p+ diffusion leading to substrate 22 forming isolation regions 28 and n-type islands 30. A very thin layer 26 of $SiO_2$ is again formed on and in the entire wafer surface.

In step (C) of FIG. 2, $SiO_2$ layer 26 is again selectively etched at 29 using an isolation mask, not illustrated, and a shallow p-type diode diffusion is formed in layer 24 creating anode 32. A very thin layer 26 of $SiO_2$ is again formed to cover the entire wafer surface, not shown. As in step (B) the successive intermediate $SiO_2$ layer need only be of a sufficient thickness to protect the part not etched away in the succeeding step. Step B, step C and each successive such step results in the formation of a $SiO_2$ layer which is thicker than the previously formed.

Before the metallization step (D) in FIG. 2 is performed, it is again necessary to etch away the $SiO_2$ insulating layer from the wafer, using an appropriate mask, wherever it is desired to form metal to semiconductor contacts. Evaporated aluminum is then deposited over the entire wafer surface, which deposit can be substantially the same thickness as the $SiO_2$ layer, namely, $0.7\mu$. Finally, the aluminum is etched away from the undesirable areas using a metallization mask, not illustrated, leaving aluminum conductors 34 and 36, being anode and cathode connections, respectively.

In step (E) of FIG. 2, a final coating of $SiO_2$ has been formed on the outer surface of the wafer with a predetermined thickness, so that a Fresnel lens 38 can be formed by etching or otherwise fabricating a series of concentric slits 40, with alternate protuberances 42, as best shown in FIG. 4. As a practical matter, lens 38 may have, for example, from 10 to 100 slits formed around each LED. The thickness of the $SiO_2$ layer can be from $1\mu$ to $18\mu$ depending on the depth of grooves 40, the wavelength, and the character of the display desired.

FIG. 3 shows a top view of the batch fabricated LED of FIG. 2 showing the disposition of conductors 34 and 36 and the isolating regions 28. It should be noticed that the configuration is substantially square in configuration to obtain the maximum utilizable light emitting area, although a circular configuration could be used depending on the configuration of the display.

Figure 5:
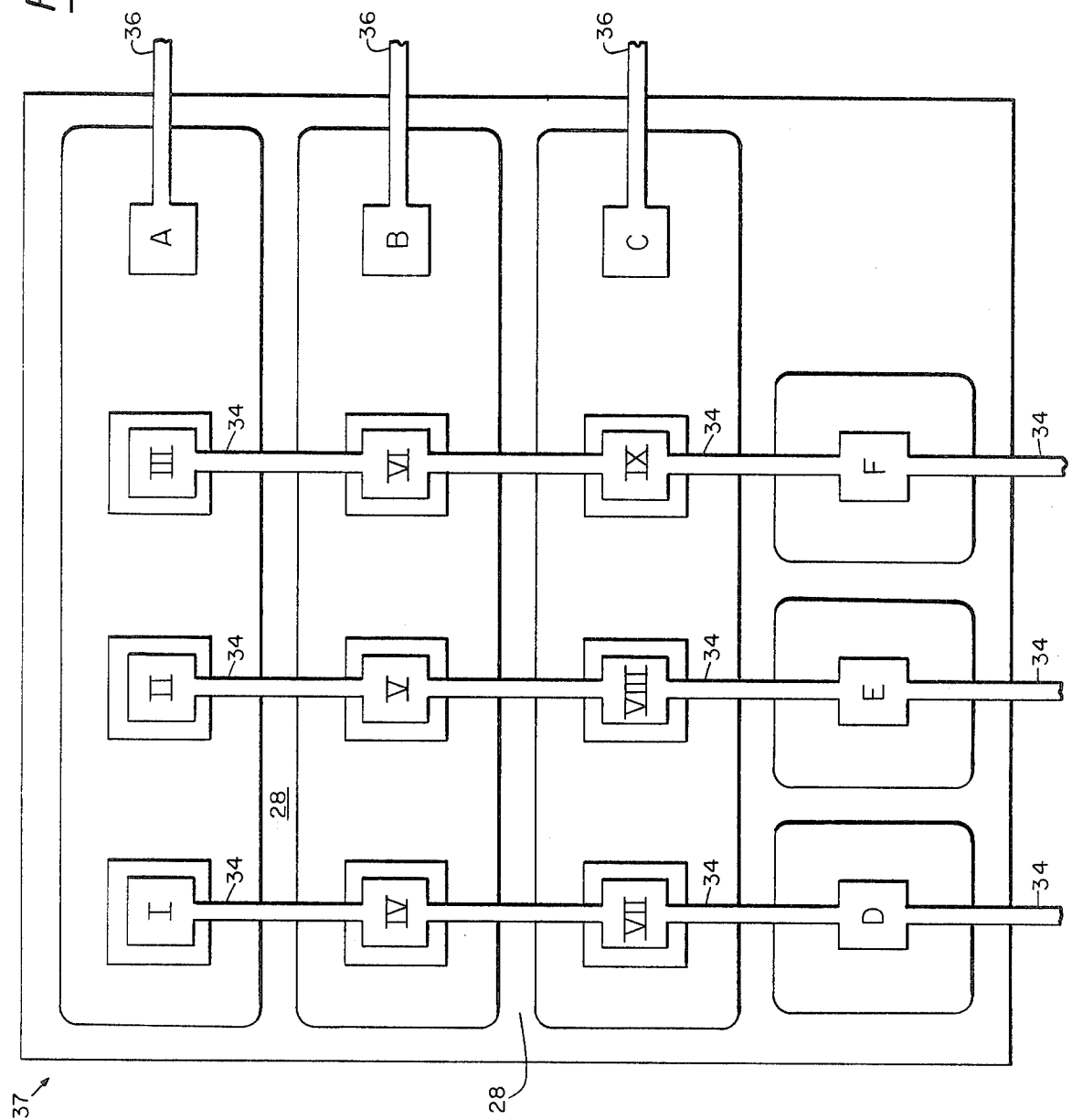
FIG. 5 is a plan view of one form of a display array composed of a regular arrangement of display devices fabricated simultaneously by the method of this invention.

FIG. 5 shows an example of a batch fabricated LED array 37, being a 3×3 LED array, the nine LED's, numbered I to IX, appropriately labelled in the figure, are batch fabricated simultaneously in the manner described with reference to FIGS. 2 and 3. Diodes I, II and III have common cathodes 36, with the cathode connection being at bonding plate A. Diodes I, IV and VII have common anodes 34, with the connection being at bonding plate D. Thus, the diode junction voltage for diode I is the difference between the voltages at points A and D. That is $$V_I = V_A - V_D,$$

similarly $$V_{II} = V_A - V_E$$

$$V_{III} = V_B - V_D, \text{ etc.}$$

By strobing, that is, the varying of the voltages at points A to F, designated diodes can be turned on intermittently. In this example, suitable dimensions might be as follows

| Diode Size | = 4 mils × 4 mils |
|---|---|
| Slit Width/Depth | = 0.125μ |
| Wavelength (λ) | = 0.5μ |

FIG. 4 shows a greatly enlarged partial cross-sectional view taken through one of the diodes and its integral lens structure 38. Light rays 44 are shown emitting from a focal point 45 at the p-n junction 46. Rays 44a and 44c pass through the centerpoint of adjacent slits 40, while ray 44b passes through the centerpoint of an intermediate protrusion 42. Both slits 40 and protrusions 42 are transparent regions of the SiO2 layer 26. It is well known that the device geometry can be selected such that the light emitted at point 45 will arrive at the centers of slits 40 and protrusions 42 in phase, and so that the emitting light rays emitted through the top plane of Fresnel lens 38 will be parallel to each other to achieve a collimated display beam. Thus, a maximum amount of light from the LED's is available for display purposes.

The significance of the novel manufacturing method and apparatus can be illustrated best by the following cost figures. For example, using as a model, a 20×50 LED array being used as a typical building block in display devices, the total production cost of producing such an array using the prior art production techniques as described with reference to FIGS. 1a and 1b is about $50.00

It is estimated that the cost of producing the same 20×50 LED array following the teaching of the present invention described with reference to FIGS. 2 and 3 is about $1.00—one fiftieth of the prior art cost.

Thus, the greatly reduced cost of producing light emitting arrays by monolithic techniques taught by the present invention achieves a long sought goal. This accomplishment increases its use in a wider number of applications, for example, as a substitute for cathode ray tubes in various types of instrumentation. Equally important, is that the available light from the LED's is greatly enhanced by the teaching of the present invention, whereas in the past the LED's operated in a marginal region limiting their use to applications that could tolerate a low light transmission.

Obviously many modifications and variations of the present invention are possible in the light of the above teachings. It is therefore to be understood that within the scope of the appended claims the invention may be practiced otherwise than as specifically described.

What is claimed is:

1. In the process of fabricating an electrooptical device by means of the epitaxial growth of a silicon wafer using a series of conventional oxidizing, photomasking, etching, diffusion and metallizing steps, with intermediate oxidizing steps therebetween to form a thin transparent protective layer of silicon dioxide, the final oxidizing step forming a silicon dioxide layer having a predetermined thickness capable of containing a lens structure, and removing intermittent portions of the silicon layer to a depth less than said predetermined thickness to form a totally transparent Fresnel lens thereby providing a predetermined light pattern.

2. A monolithic method of manufacturing a light emitting display comprising the steps of:
   fabricating a semiconductor device of monocrystalline material by the conventional production method steps of repeated oxidation, photomasking, etching, and doping wherein
   said oxidation steps form a built up layer of a protective silicon dioxide on the device after the other method steps and
   a final oxidation step forms a silicon dioxide layer having a predetermined thickness capable of containing a lens structure;
   forming a totally trasparent lens structure solely of and in the upper surface of said final silicon dioxide layer around said device by removing intermittent portions of said upper surface to a depth less than said predetermined thickness to provide a predetermined light pattern.

3. The method of claim 2 wherein the forming step provides the lens with a variable thickness.

4. The method of claim 2 wherein said forming step includes the step of making a predetermined pattern of spaced slits in the surface of said lens material creating intermittent flat protrusions.

5. The method of claim 4 wherein said forming step comprises the step of making a series of concentrically spaced protrusions of a predetermined depth and width to produce a Fresnel lens to enable the emitting light rays from said semiconductor to be collimated.

6. The method of claim 5 wherein said protuberances have flat tops all lying substantially in a common plane.

7. The method of claim 2 wherein a plurality of said semiconductor devices and integral lens structure are batch-fabricated simultaneously to form a predetermined light emitting array of said devices.

8. A monolithic method of manufacturing a light emitting display array comprising the steps of:
   fabricating a monocrystalline silicon wafer structure including an n-doped silicon substrate layer;
   fabricating a plurality of spaced semiconductor devices simultaneously in said wafer by means of a series of oxidizing, diffusion, masking etching, and metallization steps;
   said oxidation steps form a built up protective layer of a protective silicon dioxide on the devices after the other method steps and the
   final oxidation step forms a silicon dioxide layer having a predetermined thickness capable of containing a lens structure for each of said semiconductor devices;
   etching a lens structure to a depth less than said predetermined thickness in the top surface of said final silicon dioxide layer around each of said semiconductor devices to provide a predetermined light pattern.

9. The monolithic method of claim 8 wherein the step of etching forms a plurality of spaced protrusions having substantially the same height.

10. The method of claim 9 wherein the width of the spaces and of the protrusions are substantially the same as the height of the protrusions.

* * * * *